(12) United States Patent
Markle

(10) Patent No.: US 6,660,651 B1
(45) Date of Patent: Dec. 9, 2003

(54) ADJUSTABLE WAFER STAGE, AND A METHOD AND SYSTEM FOR PERFORMING PROCESS OPERATIONS USING SAME

(75) Inventor: Richard J. Markle, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 136 days.

(21) Appl. No.: 10/010,463

(22) Filed: Nov. 8, 2001

(51) Int. Cl.$^7$ ............................................. H01L 21/00
(52) U.S. Cl. ............. 438/729; 156/345.24; 156/345.51; 438/9; 438/694
(58) Field of Search ................. 156/345.23, 345.51, 156/345.55, 345.24; 438/8, 9, 694–729; 216/67

(56) References Cited

U.S. PATENT DOCUMENTS

| | | | | |
|---|---|---|---|---|
| 4,836,905 A | * | 6/1989 | Davis et al. | 156/345.51 |
| 5,076,877 A | * | 12/1991 | Ueda et al. | 156/345.55 |
| 5,928,732 A | | 7/1999 | Law et al. | 427/579 |
| 6,057,244 A | | 5/2000 | Hausmann et al. | 438/706 |
| 6,068,784 A | | 5/2000 | Collins et al. | 216/68 |
| 6,235,646 B1 | | 5/2001 | Sharan et al. | 438/771 |
| 6,251,792 B1 | | 6/2001 | Collins et al. | 438/710 |
| 6,258,220 B1 | | 7/2001 | Dordi et al. | 204/198 |

* cited by examiner

Primary Examiner—William A. Powell
(74) Attorney, Agent, or Firm—Williams, Morgan & Amerson, P.C.

(57) ABSTRACT

A process tool comprised of an adjustable wafer stage and various methods and systems for performing process operations using same is disclosed herein. In one illustrative embodiment, the process tool is comprised of a process chamber, and an adjustable wafer stage in the process chamber to receive a wafer positioned thereabove, the wafer stage having a surface that is adapted to be raised, lowered or tilted. In further embodiments, the process tool further comprises at least three pneumatic cylinders or at least three rack and pinion combinations, each of which are operatively coupled to the wafer stage by a ball and socket connection. A system disclosed herein is comprised of a metrology tool for measuring a plurality of wafers processed in a process tool to determine across-wafer variations produced by the process tool, a process tool comprised of an adjustable wafer stage that has a surface adapted to receive a wafer to be processed in the tool, and a controller for adjusting a plane of the surface of the wafer stage based upon the determined across-wafer variations produced by the tool, whereby the process tool processes at least one subsequently processed wafer positioned on the wafer stage after the plane of the surface of the wafer stage has been adjusted.

86 Claims, 3 Drawing Sheets

ADJUSTABLE WAFER STAGE, AND A METHOD AND SYSTEM FOR PERFORMING PROCESS OPERATIONS USING SAME

BACKGROUND OF THE INVENTION

1. Field of the Invention

This invention relates generally to semiconductor fabrication technology, and, more particularly, to an adjustable wafer stage, and a method and system for performing process operations using same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 of the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, insulating materials, metals, etc., and the selective removal of portions of those layers by performing known photolithographic and etching techniques. These processes, along with various ion implant and heating processes, are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed with a high degree of accuracy due to the reduced size of those features in such modern devices. For example, gate electrodes may now be patterned to a width 12 that is approximately 0.18 $\mu$m (1800 Å), and further reductions are planned in the future. The width 12 of the gate electrode 14 corresponds approximately to the channel length 13 of the transistor 10 when it is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc. Thus, even slight variations in the actual dimension of the feature as fabricated may adversely affect device performance. Thus, there is a great desire for a method that may be used to accurately, reliably and repeatedly form features to their desired critical dimension, e.g., to form the gate electrode 14 to its desired critical dimension 12.

In manufacturing semiconductor devices, many deposition processes and etching processes may be performed. For example, a variety of process layers, e.g., layers of polysilicon, metal or insulating materials, may be formed by performing a variety of deposition processes, e.g., chemical vapor deposition ("CVD"), plasma enhanced chemical vapor deposition ("PECVD"), physical vapor deposition ("PVD"), etc. Additionally, a variety of etching processes, such as a dry plasma etching process, may be performed to pattern an underlying process layer.

Unfortunately, many processes used in manufacturing integrated circuit devices, such as deposition and etch processes, tend to exhibit across-wafer variations. For example, a deposition process may tend to produce process layers that are thicker near an edge region of the wafer than near a center region of the wafer, and vice versa. Moreover, this variation may not be uniform around the circumference of the wafer, i.e., the thickness variation may occur in only one quadrant of the wafer. Similarly, etching processes may exhibit across-wafer non-uniformity characteristics. For example, the etching rate may be greater near a center region of the wafer than it is near an edge region of the wafer. Moreover, as with deposition processes, these variations may not be uniform around the circumference of the wafer, i.e., they may occur in localized areas.

Such variations are problematic in modern integrated circuit manufacturing. Such variations, even if small in absolute magnitude, may adversely impact the ability to form features on integrated circuits with the precision required for modern integrated circuit devices. Additionally, such process variations may require adjustments to subsequent processing operations in an attempt to compensate for the across-wafer variations. For example, a deposition process may result in a process layer that is thicker at the edge of the wafer than it is at the center of the wafer, i.e., the process layer may have a surface profile that is approximately concave. In that situation, a subsequent chemical mechanical polishing ("CMP") process may be performed in which parameters of the CMP process are adjusted in an effort to increase the polishing performed near the edge region of the wafer. Accordingly, such across-wafer variations resulting from certain processing operations are undesirable.

The present invention is directed to overcoming, or at least reducing the effects of, one or more of the problems described above.

SUMMARY OF THE INVENTION

The present invention is generally directed to a process tool comprised of an adjustable wafer stage, and various methods and systems for performing process operations using same. In one illustrative embodiment, the process tool is comprised of a process chamber, and an adjustable wafer stage positioned in the process chamber to receive a wafer positioned thereabove, the wafer stage having a surface that is adapted to be raised, lowered or tilted. In further embodiments, the process tool may be comprised of a plurality of pneumatic cylinders or rack and pinion combinations that are operatively coupled to the wafer stage. The cylinders and rack and pinion combinations may be used to move or adjust the wafer stage. In even further embodiments, the process tool may further comprise at least three pneumatic cylinders or at least three rack and pinion combinations, each of which are operatively coupled to the wafer stage by a ball and socket connection.

One illustrative method disclosed herein comprises providing a process chamber comprised of a wafer stage, the wafer stage having a surface that is adjustable, adjusting the surface of the wafer stage by performing at least one of raising, lowering and varying a tilt of the surface of the wafer stage, positioning a wafer on the wafer stage, and performing a process operation on the wafer positioned on the wafer stage. In further embodiments, the method further comprises adjusting the surface of the wafer stage by actuating at least one of a plurality of pneumatic cylinders that are operatively coupled to the wafer stage, or by actuating at least one of a plurality of rack and pinion combinations that are operatively coupled to the wafer stage.

Another illustrative method of the present invention comprises performing a process operation in a process tool on each of a plurality of wafers, measuring a plurality of the processed wafers to determine across-wafer variations produced by the process operation performed in the process tool, adjusting, based upon the measured across-wafer variations, a plane of a surface of an adjustable wafer stage, and performing the process operation on at least one subsequently processed wafer positioned on the wafer stage in the process chamber after the plane of the wafer stage has been adjusted. In further embodiments, the method further comprises measuring a plurality of the processed wafers to determine across-wafer variations in a thickness or in feature sizes produced by the process operation. The method may further comprise performing at least one of raising, lowering and tilting, based upon the measured across-wafer variations, the plane of the surface of the adjustable wafer stage.

The present invention is also directed to a system that may be used to perform the methods described herein. In one embodiment, the system is comprised of a metrology tool for measuring a plurality of wafers processed in a process tool to determine across-wafer variations produced by the process tool, a process tool comprised of an adjustable wafer stage that has a surface adapted to receive a wafer to be processed in the tool, and a controller for adjusting a plane of the surface of the wafer stage based upon the determined across-wafer variations produced by the tool, whereby the process tool processes at least one subsequently processed wafer positioned on the wafer stage after the plane of the surface of the wafer stage has been adjusted.

BRIEF DESCRIPTION OF THE DRAWINGS

The invention may be understood by reference to the following description taken in conjunction with the accompanying drawings, in which like reference numerals identify like elements, and in which.

Figure 1:
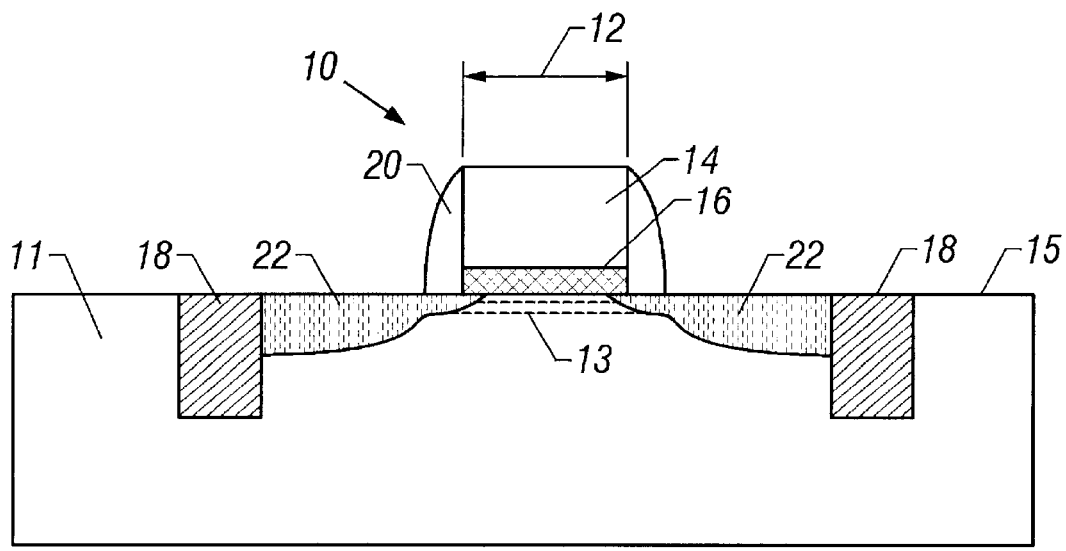
FIG. 1 is a cross-sectional view of an illustrative prior art transistor.
Figure 6:
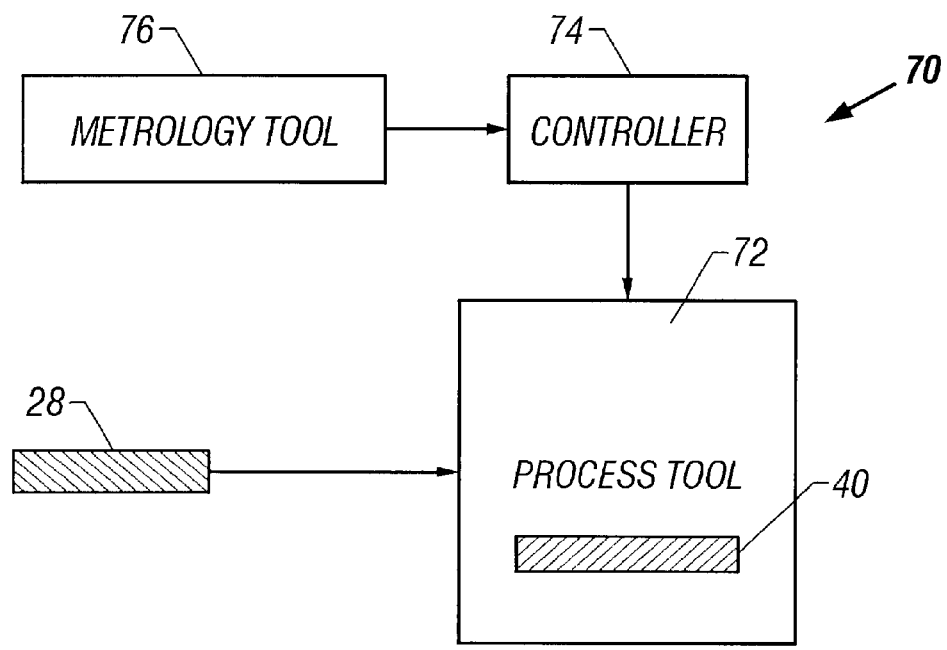
FIG. 6 depicts an illustrative embodiment of a system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and structures depicted in the drawings may be exaggerated or reduced as compared to the size of those features or structures on real-word systems. Moreover, for purposes of clarity, the illustrative system depicted herein does not include all of the supporting utilities and devices of such a system. Nevertheless, the attached drawings are included to describe and explain illustrative examples of the present invention.

In general, the present invention is directed to a process tool comprised of an adjustable wafer stage, and various methods and systems for performing process operations using same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc. Moreover, the present invention may be employed with a variety of processes performed in semiconductor manufacturing.

As stated previously, in manufacturing integrated circuit devices, many deposition and etching processes, e.g., CVD, PECVD and PVD deposition processes, chemical etching processes, sputter etching processes, reactive ion etching processes, etc., may be performed. The processing tools for performing such processes, i.e., deposition tools and etch tools, may have various physical configurations that depend upon a variety of factors, e.g., the manufacturer, the type of process to be performed, etc. U.S. Pat. Nos. 6,068,784 and 6,251,792 B1 depict illustrative processing tools that may be used in modern semiconductor manufacturing. Both of these patents are hereby incorporated by reference in their entirety. However, many, if not all, of such tools have a process chamber, where processing operations will be performed, and a wafer stage or chuck in the process chamber that is adapted to hold a wafer in position during processing, typically through use of vacuum pressure or one or more clamps. In many tools, the wafer stage is actually an electrode that is used to ground the wafer while a plasma is created above the wafer by other electrodes or coils in such tools. The present invention is generally directed to a wafer stage having an adjustable surface or plane, such that the plane of the wafer stage may be raised, lowered or tilted. By adjusting the plane of the wafer stage, the present invention may be useful in reducing or overcoming some of the problems described in the background section of this application.

An illustrative wafer stage 40 in accordance with one embodiment of the present invention will now be described with reference to FIGS. 2–3. As shown therein, the wafer stage 40 has a top surface 42 and a bottom surface 43. In operation, a wafer (not shown) may be positioned on the top surface 42 of the wafer stage 40 and processing operations may then be performed on the wafer. The wafer may be secured to the stage by a plurality of clamps (not shown) and/or a vacuum chuck (not shown). Given the moveable nature of the wafer stage 40 of the present invention, the utilities for actuating the clamps and/or providing a vacuum may have to be flexibly coupled to the wafer stage 40 via flexible hoses and the like. The particular arrangements of such connections are well within the knowledge of those skilled in the art. Accordingly, they will not be described in any detail.

The top surface 42 of the wafer stage 40 defines a plane 44 that, as described more fully below, may be raised, lowered or tilted at an angle 45 as desired. The magnitude by which the surface 42 may be raised, lowered or tilted may vary depending upon the particular application. In one embodiment, the surface 42 of the wafer stage 40 may be raised or lowered approximately 0.25–3.0 inches, and the plane 44 of the surface 42 of the wafer stage 40 may vary from approximately 0–25 degrees relative to a horizontal surface. Moreover, as will be recognized by those skilled in the art after a complete reading of the present application the surface 42 may be adjusted dynamically during a process operation, or it may be adjusted only a single time prior to performing a process operation on a wafer positioned thereon. Additionally, the surface 42 may be adjusted based upon metrology data obtained for wafers to be processed in a process tool (i.e., a feed-forward mode), or based upon metrology data obtained for wafers that have previously been processed in the process tool (i.e., a feed-back mode).

A mechanism useful in adjusting the position of the wafer stage 40 may be comprised of any of a variety of devices, such as pneumatic, hydraulic, electromagnetic or mechanical systems. In the disclosed embodiment, each of three pneumatic cylinders 46 (only one of which is shown in FIG. 2) are operatively coupled to the bottom surface 43 of the wafer stage 40 via a ball and socket connection 48. As shown in FIG. 3, a bottom view taken along the line "3—3" in FIG. 2, the pneumatic cylinders 46 are spaced apart approximately 120 degrees under the wafer stage 40. Also depicted in FIG. 2 is an illustrative manifold 60 and a valve 61 that will be used in actuating the pneumatic cylinder 46 to control the position of the surface 42 of the wafer stage 40. Only one valve 61 is depicted in FIG. 2. However, each cylinder 46 may have its own valve 61 such that each of the cylinders 46 may be independently controlled.

The pneumatic cylinders 46 may be any type of pneumatic cylinders useful for performing the function of adjusting the surface 42 of the wafer stage 40. For example, the pneumatic cylinders 46 may be dual-acting pneumatic cylinders. The stroke, size and supply pressure to such cylinders may vary depending upon the particular application. Air or an inert gas may be supplied to the cylinders 46 at the required pressure through flexible hoses (not shown).

Figure 2:
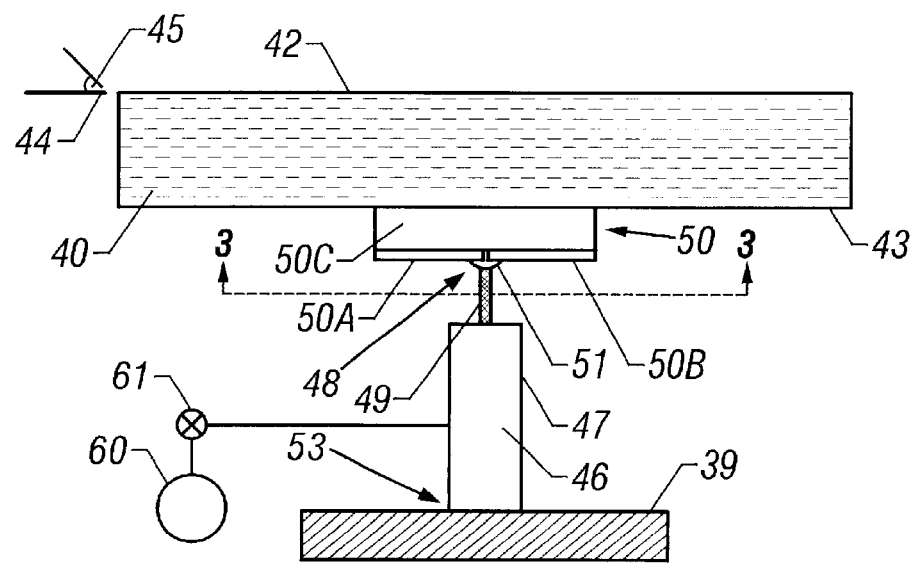
FIG. 2 is a cross-sectional view depicting an illustrative wafer stage having an adjustable surface.

The illustrative pneumatic cylinder 46 depicted in FIG. 2 is comprised of a housing 47, a shaft 49 and a ball 51 coupled to the shaft 49. The ball 51 of the cylinder 46 is operatively coupled to a housing 50 in a ball and socket arrangement 48. The housing 50 is comprised of three sections 50A, 50B and 50C. In the disclosed embodiments, the section 50C is secured to the bottom surface 43 of the wafer stage 40, and the sections 50A, 50B are secured to the section 50C by a plurality of screws 59. See FIG. 3. Of course, the ball and socket connection 48 may be achieved by a variety of different structures known to those skilled in the art. Moreover, the present inventions may be employed in situations where the pneumatic cylinders 46 may be coupled to the wafer stage 40 by another type of connection, e.g., a pinned connection. Thus, the particular details of the manner in which the cylinders 46 are operatively coupled to the wafer stage 40 should not be considered limitations of the present invention unless such details are specifically set forth in the appended claims.

Figure 3:
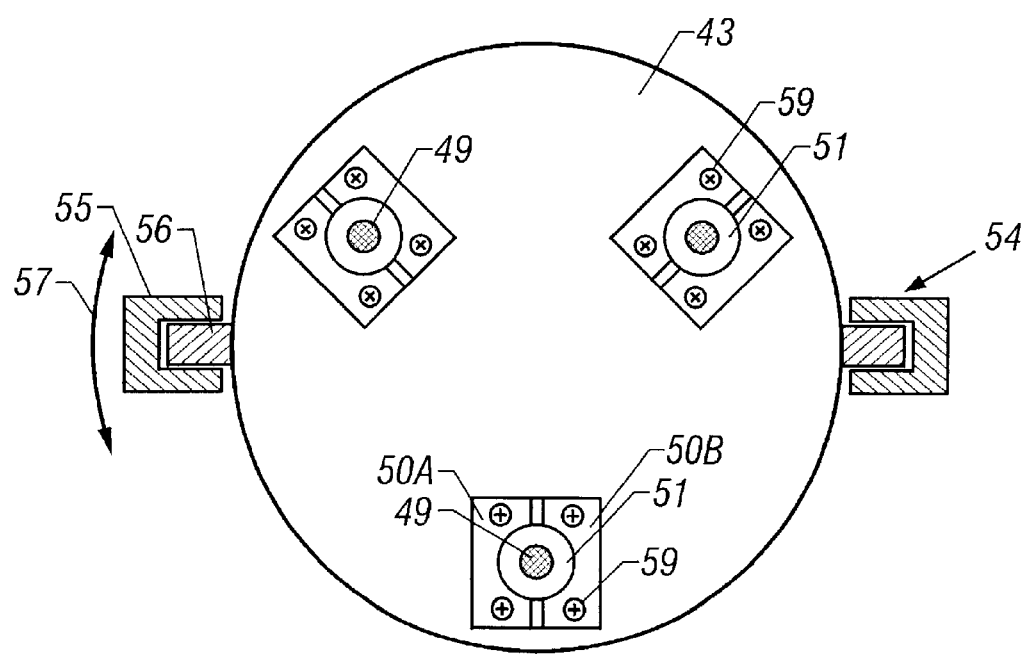
FIG. 3 is a bottom view of the illustrative wafer stage depicted in FIG. 2.

Also depicted in FIG. 3 are a plurality of guides 54 that may or may not be employed in every situation. For clarity, guides 54 are not depicted in FIG. 2. In the depicted embodiment of FIG. 3, the guides 54 are comprised of a tab 56 and a guide structure 55. The tab 56 is fixedly coupled to the wafer stage 40, and the guide structure 55 is fixedly coupled to the process chamber, or other similar fixed structure of a process tool. The guides 54 are provided to prevent or limit rotation of the wafer stage 40 in the directions indicated by arrow 57. Any number of such guides 54 may be provided. In the depicted embodiment, two such guides 54 are positioned approximately 180 degrees apart. Of course, the guides 54 must be sized so as to allow for the maximum tilt anticipated for the wafer stage 40.

In one embodiment, an end 53 of the cylinder 46 is fixed to a portion 39 of the process chamber, or other fixed structure. In other embodiments, the end 53 of the cylinder 46 may be connected to the process chamber by a pinned or ball and socket arrangement, although those situations are not depicted in FIG. 2. It should be understood that the portion 39 of the process chamber is intended to be representative in nature. That is, the portion 39 may be any portion of a process chamber or other structure that is stationary and provides an adequate foundation for anchoring the end 53 of the cylinder 46.

Figure 4:
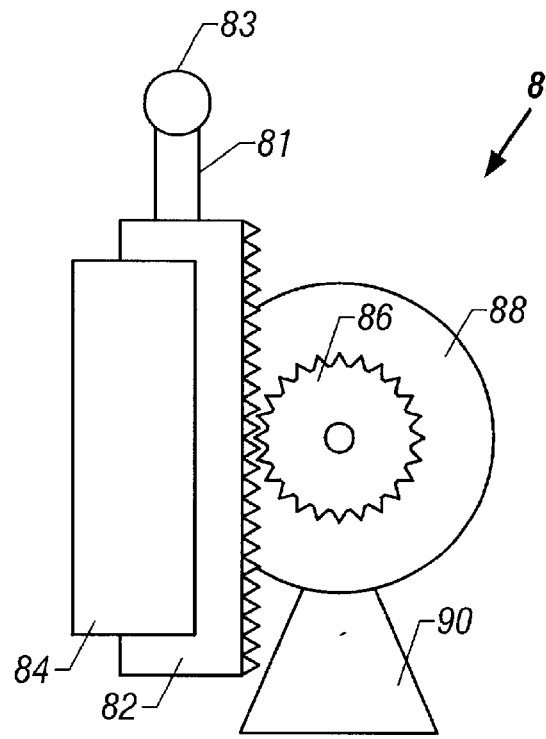
FIGS. 4 and 5 are views of one illustrative rack and pinion assembly that may be employed with the present invention.
Figure 5:
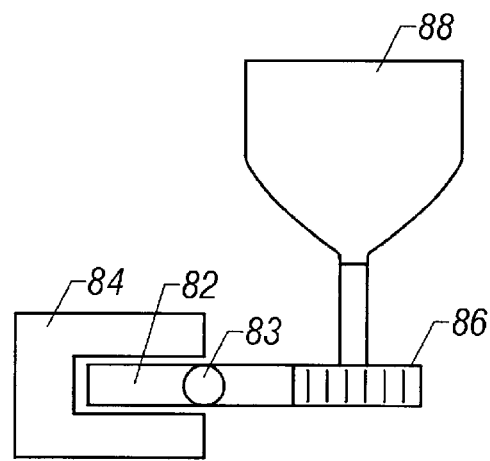

Of course, structures other than the pneumatic cylinders 46 depicted in FIG. 2 may be employed for raising, lowering or tilting the surface 42 of the wafer stage 40. For example, as shown in FIGS. 4 and 5, in place of each of the pneumatic cylinders 46, a rack and pinion assembly arrangement 80 may be provided. In one illustrative embodiment, the rack and pinion assembly 80 is comprised of a rack 82, a pinion 86, a guide 84 and an electric motor 88 having a motor support 90. A shaft 81 and ball 83 are coupled to the rack 82. The rack 82 is adapted to slide with the guide 84 when the motor 88 is actuated. The rack 82 and the motor support 90 may be fixedly coupled to any portion of the process chamber sufficient to provide the necessary anchoring support for these structures. The electric motor 88 may be any type of electric motor, such as a stepper motor. By actuation of the electric motor 88, the rack 82 may be raised or lowered, thereby raising, lowering or adjusting the angle 45 of the surface 42 of the wafer stage 40.

An illustrative system 70 that may be used in one embodiment of the present invention is shown in FIG. 4. In one embodiment, the system 70 is comprised of a process tool 72 and a controller 74. In other embodiments, the system further comprises a metrology tool 76. In general, a wafer 28 is provided to the process tool 72 where a process operation will be performed on the wafer 28. The controller 74 may be used to raise, lower or adjust the tilt of the surface 42 of the wafer stage 40. The controller 74 may use feed-forward or feed-back metrology data to raise, lower or tilt the surface 42 of the wafer stage 40.

The process tool 72 may be any type of processing tool commonly found in semiconductor manufacturing operations. For example, the process tool 72 may be a deposition tool adapted to perform at least one of a CVD, PECVD or PVD process. As another example, the process tool may be an etching tool, such as a plasma etching tool, a sputter etch tool, a reactive ion etching tool, etc.

If used, the metrology tool 76 may be any type of tool useful for determining across-wafer variations resulting from the process tool 72. For example, the metrology tool 76 may be an ellipsometer or a profilometer useful for determining across-wafer thickness variations in a deposited process layer. Alternatively, the metrology tool 76 may be a scanning electron microscope or a scatterometer useful for inspecting features formed by an etching process to detect for areas of the wafer 28 where the etching process may be too aggressive, i.e., where features are formed with critical dimensions that are smaller than anticipated, or features that exhibit undercutting. Such a metrology tool 76 may also be useful in determining where etching has been less than complete.

In one embodiment, the measurements taken by the metrology tool 76 may be performed on any desired number of wafers before or after the wafers have been processed in the process tool 72. For example, such measurements may be performed on all wafers in one or more lots, or on a representative number of wafers in a given lot, and these results may then be used to control or adjust the relative position of the surface 42 of the wafer stage 40 in the process tool 72 on subsequently processed wafers. Additionally, more than one lot of wafers may be analyzed until such time as the process engineer has achieved a sufficiently high degree of confidence that the metrology accurately reflects the across-wafer characteristics of a process tool 76 or of a particular process flow.

The number of and location of the measurements taken by the metrology tool 76 on any particular wafer may be varied as a matter of design choice. The more measurements taken, the higher degree of likelihood that the measurements actually reflect real-world conditions. However, the responsible process engineer may decide on an appropriate number of measurements to be taken, as well as the location of those measurements consistent with the degree of confidence desired by the process engineer with respect to the particular application under consideration.

Control equations may be employed to raise, lower or adjust the angle of the surface 42 of the wafer stage 40 in situations where the methods described herein indicate that such an adjustment is warranted, e.g., when across-wafer variations in thickness and/or feature sizes are present. That is, the metrology data may be used in either a feed-forward or feedback manner to control the adjustment of the surface 42 of the wafer stage 40. The control equations may be developed empirically using commonly known linear or non-linear techniques. The controller 74 may automatically control the plane 44 of the surface 42 of the wafer stage 40. Through use of the present invention, the extent and magnitude of across-wafer variations performed by various process tools 72 may be reduced. That is, by effectively repositioning all, or a portion, of the surface 42, the variations resulting from a process may be reduced or eliminated. For example, if a particular area or region of a process layer is formed too thick, the surface 42 may be tilted so as to position the affected portion further away from, for example, a target in a PVD system, thereby reducing the thickness of the process layer in that localized area.

The controller 74 may be used to monitor and control the positioning of the surface 42 of the wafer stage 40 within a process chamber. Such positioning may be relative to any reference point or plane. For example, with respect to a PVD system, the positioning of the surface 42 of the wafer stage 40 may be made with respect to an upper electrode (not shown), or target, commonly found in such systems. In effect, the adjustable wafer stage 40 of the present invention may be used to vary the distance between the target (upper electrode) and wafer stage (bottom electrode) in such systems, thereby affecting the deposition rates of the material formed on a wafer during such a PVD process.

The controller 74 may sense or detect the positioning of the surface 42 by a variety of known techniques. For example, in the case where a rack and pinion combinations, i.e., rack 82 and pinion 86, are used to adjust the surface 42, the controller may sense the steps taken by the stepper motor 88, and correlate that with the vertical travel of the ball 83. Alternatively, one or more metrology tools (not shown) for detecting the travel of the rack 82 or ball 51 on the pneumatic cylinder 46. As another example, the pneumatic cylinder 46 may be provided with sensors to detect the travel of the rod 49 of the cylinder 46. Initially, the controller 74 may position the surface 42 at an approximately horizontal position with the travel rack 82 and/or rod 49 of the hydraulic cylinders 46 located at the approximate middle of their overall travel length.

In the illustrated embodiment, the controller 74 is a computer programmed with software to implement the functions described herein. Moreover, the functions described for the controller 74 may be performed by one or more controllers spread through the system. For example, the controller 74 may be a fab level controller that is used to control processing operations throughout all or a portion of a semiconductor manufacturing facility. Alternatively, the controller 74 may be a lower level computer that controls only portions or cells of the manufacturing facility. Moreover, the controller 74 may be a stand-alone device, or it may reside on the process tool 72. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities an these quantities. Unless specifically stated otherwise, or as is apparent from the discussion, terms such as "processing" or "computing" or "calculating" or " determining" or " displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 74, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81—0699—Provisional Specification for CIM Framework Domain Architecture) and APC (SEMI E93—0999—Provisional Specification for CIM Framework Advanced Process Control Component) specifications are publicly available from SEMI.

The present invention may be employed in a variety of contexts. For example, metrology data may indicate that a particular deposition tool forms a process layer that has a generally concave surface profile that is approximately uniform around the circumference of the wafer. In that situation, the method disclosed herein may involve raising or lowering the surface 42 of the wafer 40 while insuring that it remains approximately horizontal. In other situations, the metrology data may indicate that, while there is across-wafer variations in the thickness of the process layer formed in a deposition tool, such variations are rather localized in nature, e.g., the process layer exhibits variations near an edge region of the wafer for a distance of approximately 180 degrees around the circumferences of the wafer. In that situation, the controller 74 may act to adjust the tilt of the surface 42, by either raising or lowering the affected side. Similar adjustments may be made with other types of processes, e.g., etching processes. Moreover, such adjustments to the surface 42 of the wafer stage 40 may be dynamic in nature. That is, the surface 42 may be adjusted several times during a process, e.g., deposition, etching, in an effort to achieve the desired results. Thus, as those skilled in the art will understand after a complete reading of the present application, the present invention is very versatile and may be employed in a variety of ways to raise, lower or tilt the surface 42 of the wafer stage 40. Accordingly, the illustrative examples described and discussed herein should not be considered a limitation of the present invention unless such limitations are clearly set forth in the appended claims.

The present invention is generally directed to a process tool comprised of an adjustable wafer stage, and various methods and systems for performing process operations using same. In one illustrative embodiment, the process tool is comprised of a process chamber, and an adjustable wafer stage 40 positioned in the process chamber to receive a wafer positioned thereabove, the wafer stage 40 having a surface 42 that is adapted to be raised, lowered or tilted. In further embodiments, the process tool may be comprised of a plurality of pneumatic cylinders 46 or rack and pinion combinations 82, 86 that are operatively coupled to the wafer stage 40. The cylinders 46 and rack and pinion combinations 82, 86 may be used in moving or adjusting the wafer stage 40. In even further embodiments, the process tool may further comprise at least three pneumatic cylinders 46 or at least three rack and pinion combinations 82, 86, each of which are operatively coupled to the wafer stage 40 by a ball and socket connection 48.

In one illustrative embodiment, the method disclosed herein comprises providing a process chamber comprised of a wafer stage 40, the wafer stage 40 having a surface 42 that is adjustable, adjusting the surface 42 of the wafer stage 40 by performing at least one of raising, lowering and varying a tilt of the surface 42 of the wafer stage 40, positioning a wafer on the wafer stage 40, and performing a process operation on the wafer positioned on the wafer stage 40. In further embodiments, the method further comprises adjusting the surface 42 of the wafer stage 40 by actuating at least one of a plurality of pneumatic cylinders 46 that are operatively coupled to the wafer stage 40, or by actuating at least one of a plurality of rack and pinion combinations 82, 86 that are operatively coupled to the wafer stage 40.

In another illustrative embodiment, the method comprises performing a process operation in a process tool on each of a plurality of wafers, measuring a plurality of the processed wafers to determine across-wafer variations produced by the process operation performed in the process tool, adjusting, based upon the measured across-wafer variations, a plane 44 of a surface 42 of an adjustable wafer stage 40, and performing the process operation on at least one subsequently processed wafer positioned on the wafer stage 40 in the process chamber after the plane 44 of the wafer stage 40 has been adjusted. In further embodiments, the method further comprises measuring a plurality of the processed wafers to determine across-wafer variations in a thickness or in feature sizes produced by the process operation. The method may further comprise performing at least one of raising, lowering and tilting, based upon the measured across-wafer variations, the plane 44 of the surface 42 of the adjustable wafer stage 40.

The present invention is also directed to a system that may be used to perform the methods described herein. In one embodiment, the system is comprised of a metrology tool 76 for measuring a plurality of wafers processed in a process tool 72 to determine across-wafer variations produced by the process tool 72, a process tool 72 comprised of an adjustable wafer stage 40 that has a surface 42 adapted to receive a wafer to be processed in the tool 72, and a controller 76 for adjusting a plane 44 of the surface 42 of the wafer stage 40 based upon the determined across-wafer variations produced by the tool 72, whereby the process tool 72 processes at least one subsequently processed wafer positioned on the wafer stage 40 after the plane 44 of the surface 42 of the wafer stage 40 has been adjusted.

In another embodiment, the system is comprised of a means for measuring a plurality of wafers processed in a process tool to determine across-wafer variations produced by the process tool, a process means for performing a process operation, the process means comprised of an adjustable wafer stage 40 that has a surface 42 adapted to receive a wafer to be processed in the tool, and a controller means for adjusting a plane 44 of the surface 42 of the wafer stage 40 based upon the determined across-wafer variations produced by the tool, whereby the process means processes at least one subsequently processed wafer positioned on the wafer stage 40 after the plane 44 of the surface 42 of the wafer stage 40 has been adjusted. In the disclosed embodiment, the means for measuring the plurality of wafers is the metrology tool 76, the process means is the process tool 72, and the controller means is the controller 74. The present invention is also directed to means for moving or positioning the wafer stage 40. In the disclosed embodiment, such means are the plurality of pneumatic cylinders 46 and the rack and pinion combinations 82, 86.

Through use of the present invention, better process control may be achieved in modern integrated circuit manufacturing facilities. Additionally, the present invention may enable more precise formation of various features of integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A process tool, comprising:
   a process chamber;
   a wafer stage in said process chamber to receive a wafer positioned thereabove, said wafer stage having a surface that is adapted to be raised, lowered or tilted; and
   at least three pneumatic cylinders operatively coupled to said stage that, when actuated, may be used in raising, lowering or tilting said surface of said wafer stage.

2. The process tool of claim 1, wherein said process chamber is comprised of at least one of a deposition chamber and an etch chamber.

3. The process tool of claim 1, wherein said process chamber is a deposition chamber adapted to perform at least one of a chemical vapor deposition process, a plasma enhanced chemical vapor deposition process and a physical vapor deposition process.

4. The process tool of claim 1, wherein said process chamber is an etch chamber adapted to perform at least one of a chemical etching process, a sputter etching process, and a reactive ion etching process.

5. The process tool of claim 1, wherein each of said at least three pneumatic cylinders are operatively coupled to said wafer stage by a ball and socket connection.

6. The process tool of claim 1, wherein said at least three pneumatic cylinders are spaced apart approximately 120 degrees.

7. A process tool, comprising:
   a process chamber;
   a wafer stage in said process chamber to receive a wafer positioned thereabove, said wafer stage having a surface that is adapted to be raised, lowered or tilted; and
   at least three rack and pinion combinations operatively coupled to said wafer stage that, when actuated, may be used in raising, lowering or tilting said surface of said wafer stage.

8. The process tool of claim 7, wherein said process chamber is comprised of at least one of a deposition chamber and an etch chamber.

9. The process tool of claim 7, wherein said process chamber is a deposition chamber adapted to perform at least one of a chemical vapor deposition, a plasma enhanced chemical vapor deposition process and a physical vapor deposition process.

10. The process tool of claim 7, wherein said process chamber is an etch chamber adapted to perform at least one of a chemical etching process, a sputter etching process, and a reactive ion etching process.

11. The process tool of claim 7, further comprising an electric motor operatively coupled to each of said rack and pinion combinations.

12. The process tool of claim 7, wherein each of said at least three rack and pinion combinations are operatively coupled to said wafer stage by a ball and socket connection.

13. The process tool of claim 7, wherein said at least three rack and pinion combinations are spaced apart approximately 120 degrees.

14. A method, comprising:
   providing a process chamber comprised of a wafer stage, said wafer stage having a surface that is adjustable;
   adjusting said surface of said wafer stage by performing at least one of raising, lowering and varying a tilt of said surface of said wafer stage;
   positioning a wafer on said wafer stage after said wafer stage has been adjusted; and
   performing a process operation on said wafer positioned on said wafer stage.

15. The method of claim 14, wherein providing a process chamber comprises providing at least one of a deposition chamber and an etching chamber.

16. The method of claim 14, wherein performing a process operation on said wafer comprises performing at least one of a deposition process and an etching process on said wafer in said process chamber.

17. The method of claim 14, wherein adjusting said surface of said wafer stage comprises adjusting said surface of said wafer stage by actuating at least one of a plurality of pneumatic cylinders that are operatively coupled to said wafer stage.

18. The method of claim 14, wherein adjusting said surface of said wafer stage comprises adjusting said surface of said wafer stage by actuating at least one of a plurality of rack and pinion combinations that are operatively coupled to said wafer stage.

19. A method, comprising:
   providing a process chamber comprised of a wafer stage, said wafer stage having a surface that is adjustable;
   adjusting said surface of said wafer stage by actuating at least one of a plurality of pneumatic cylinders that are operatively coupled to said wafer stage to accomplish at least one of raising, lowering and varying a tilt of said surface of said wafer stage;
   positioning a wafer on said wafer stage; and performing a process operation on said wafer positioned on said wafer stage.

20. The method of claim 19, wherein providing a process chamber comprises providing at least one of a deposition chamber and an etching chamber.

21. The method of claim 19, wherein positioning a wafer on said wafer stage comprises positioning a wafer on said wafer stage after said wafer stage has been adjusted.

22. The method of claim 19, wherein positioning a wafer on said wafer stage comprises positioning a wafer on said wafer stage before said wafer stage is adjusted.

23. The method of claim 19, wherein performing a process operation on said wafer comprises performing at least one of a deposition process and an etching process in said process chamber.

24. The method of claim 19, wherein adjusting said surface of said wafer stage comprises adjusting said surface of said wafer stage by actuating at least one of three pneumatic cylinders, each of which are operatively coupled to said wafer stage by a ball and socket connection.

25. A method, comprising:
providing a process chamber comprised of a wafer stage, said wafer stage having a surface that is adjustable;
adjusting said surface of said wafer stage by actuating at least one of a plurality of rack and pinion combinations that are operatively coupled to said wafer stage to accomplish at least one of raising, lowering and varying a tilt of said surface of said wafer stage;
positioning a wafer on said wafer stage; and
performing a process operation on said wafer positioned on said wafer stage.

26. The method of claim 25, wherein providing a process chamber comprises providing at least one of a deposition chamber and an etching chamber.

27. The method of claim 25, wherein positioning a wafer on said wafer stage comprises positioning a wafer on said wafer stage after said wafer stage has been adjusted.

28. The method of claim 25, wherein positioning a wafer on said wafer stage comprises positioning a wafer on said wafer stage before said wafer stage is adjusted.

29. The method of claim 25, wherein performing a process operation on said wafer comprises performing at least one of a deposition process and an etching process in said process chamber.

30. The method of claim 25, wherein adjusting said surface of said wafer stage comprises adjusting said surface of said wafer stage by actuating at least one of three rack and pinion combinations, each of which are operatively coupled to said wafer stage by a ball and socket connection.

31. A method, comprising:
performing a process operation in a process tool on each of a plurality of wafers;
measuring a plurality of said processed wafers to determine across-wafer variations produced by said process operation performed in said process tool;
adjusting, based upon said measured across-wafer variations, a plane of a surface of an adjustable wafer stage; and
performing said process operation on at least one subsequently processed wafer positioned on said wafer stage in said process chamber after said plane of said wafer stage has been adjusted.

32. The method of claim 31, wherein performing a process operation in a process tool on each of a plurality of wafers comprises performing a process operation comprised of at least one of a deposition process and an etching process in a process tool on each of a plurality of wafers.

33. The method of claim 31, wherein performing a process operation in a process tool on each of a plurality of wafers comprises performing at least one of a chemical vapor deposition process, a plasma enhanced chemical vapor deposition process, and a physical vapor deposition process in a process tool on each of a plurality of wafers.

34. The method of claim 31, wherein performing a process operation in a process tool on each of a plurality of wafers comprises performing at least one of a chemical etching process, a sputter etching process, and a reactive ion etching process in a process tool on each of a plurality of wafers.

35. The method of claim 31, wherein measuring a plurality of said processed wafers to determine across-wafer variations produced by said process operation comprises measuring a plurality of said processed wafers to determine across-wafer variations in a thickness of a process layer produced by said process operation.

36. The method of claim 31, wherein measuring a plurality of said processed wafers to determine across-wafer variations produced by said process operation comprises measuring a plurality of said processed wafers to determine across-wafer variations in feature sizes produced by said process operation.

37. The method of claim 31, wherein adjusting, based upon said measured across-wafer variations, a plane of a surface of an adjustable wafer stage comprises performing at least one of raising, lowering and tilting, based upon said measured across-wafer variations, said plane of said surface of said adjustable wafer stage.

38. A method, comprising:
performing a deposition process in a deposition tool on each of a plurality of wafers to form a process layer above each of said wafers;
measuring a plurality of said process layers formed above a plurality of said wafers to determine across-wafer thickness variations produced by said deposition process;
adjusting, based upon said measured across-wafer thickness variations, a plane of a surface of an adjustable wafer stage; and
performing said deposition process on at least one subsequently processed wafer positioned on said wafer stage in said deposition tool after said plane of said wafer stage has been adjusted.

39. The method of claim 38, wherein performing a deposition process in a deposition tool on each of a plurality of wafers comprises performing at least one of a chemical vapor deposition process, a plasma enhanced chemical vapor deposition process, and a physical vapor deposition process in a process tool on each of a plurality of wafers.

40. The method of claim 38, wherein adjusting, based upon said measured across-wafer thickness variations, a plane of a surface of an adjustable wafer stage comprises performing at least one of raising, lowering and tilting, based upon said measured across-wafer thickness variations, said plane of said surface of said adjustable wafer stage.

41. A method, comprising:
performing an etching process in an etching tool on a process layer formed above each of a plurality of wafers;
measuring a plurality of etched process layers on a plurality of said wafers to determine across-wafer variations in a feature size produced by said etching operation;
adjusting, based upon said measured across-wafer feature size variations, a plane of a surface of an adjustable wafer stage; and performing said etching process on at least one subsequently processed wafer positioned on said wafer stage in said etching tool after said plane of said wafer stage has been adjusted.

42. The method of claim 41, wherein performing an etching process in an etching tool comprises performing at least one of a chemical etching process, a sputter etching process, and a reactive ion etching process in an etching tool on each of a plurality of wafers.

43. The method of claim 41, wherein adjusting, based upon said measured across-wafer feature size variations, a plane of a surface of an adjustable wafer stage comprises performing at least one of raising, lowering and tilting, based upon said measured across-wafer feature size variations, said plane of said surface of said adjustable wafer stage.

44. A system, comprising:
a metrology tool for measuring a plurality of wafers processed in a process tool to determine across-wafer variations produced by said process tool;
a process tool comprised of an adjustable wafer stage that has a surface adapted to receive a wafer to be processed in said tool; and
a controller for adjusting a plane of said surface of said wafer stage based upon said determined across-wafer variations produced by said tool, whereby said process tool processes at least one subsequently processed wafer positioned on said wafer stage after said plane of said surface of said wafer stage has been adjusted.

45. The system of claim 44, wherein said metrology tool is comprised of at least one of an ellipsometer, a profilometer, a scatterometer and a scanning electron microscope.

46. The system of claim 44, wherein said metrology tool is adapted to determine across-wafer thickness variations of a process layer formed in said tool.

47. The system of claim 44, wherein said metrology tool is adapted to determine across-wafer variations in feature sizes formed by said process tool.

48. The system of claim 44, wherein said process tool is comprised of at least one of a deposition tool and an etching tool.

49. The system of claim 44, wherein said process tool is a deposition tool adapted to perform at least one of a chemical vapor deposition process, a plasma enhanced chemical vapor deposition process and a physical vapor deposition process.

50. The system of claim 44, wherein said process tool is comprised of an etching tool adapted to perform at least one of a chemical etching process, a sputter etching process, and a reactive ion etching process.

51. The system of claim 44, further comprising a plurality of pneumatic cylinders operatively coupled to said wafer stage.

52. The system of claim 44, further comprising a plurality of rack and pinion combinations operatively coupled to said wafer stage.

53. A system, comprising:
means for measuring a plurality of wafers processed in a process tool to determine across-wafer variations produced by said process tool;
process means for performing a process operation, said process means comprised of an adjustable wafer stage that has a surface adapted to receive a wafer to be processed in said tool; and
a controller means for adjusting a plane of said surface of said wafer stage based upon said determined across-wafer variations produced by said process means, whereby said process means processes at least one subsequently processed wafer positioned on said wafer stage after said plane of said surface of said wafer stage has been adjusted.

54. The system of claim 53, wherein said means for measuring a plurality of wafers is comprised of at least one of an ellipsometer, a profilometer, a scatterometer and a scanning electron microscope.

55. The system of claim 53, wherein said means for measuring a plurality of wafers is adapted to determine across-wafer thickness variations of a process layer formed by said process means.

56. The system of claim 53, wherein said means for measuring a plurality of wafers is adapted to determine across-wafer variations in feature sizes formed by said process means.

57. The system of claim 53, wherein said process means is comprised of at least one of a deposition tool and an etching tool.

58. The system of claim 53, wherein said process means is a deposition tool adapted to perform at least one of a chemical vapor deposition process, a plasma enhanced chemical vapor deposition process and a physical vapor deposition process.

59. The system of claim 53, wherein said process means is an etching tool adapted to perform at least one of a chemical etching process, a sputter etching process, and a reactive ion etching process.

60. The system of claim 53, further comprising means for moving said wafer stage.

61. The system of claim 60, wherein said means for moving said wafer stage comprises a plurality of pneumatic cylinders operatively coupled to said wafer stage.

62. The system of claim 60, wherein said means for moving said wafer stage comprises a plurality of rack and pinion combinations operatively coupled to said wafer stage.

63. A process tool, comprising:
a process chamber; and
an adjustable wafer stage in said process chamber that is adapted to receive a wafer positioned thereabove, said wafer stage having a surface in a first plane, said wafer stage being adapted to be raised to a position wherein said surface of said wafer stage is positioned in a second plane that is offset from and approximately parallel to said first plane.

64. The process tool of claim 63, wherein said adjustable wafer stage further comprises a plurality of pneumatic cylinders operatively coupled to said wafer stage.

65. The process tool of claim 63, wherein said adjustable wafer stage further comprises a plurality of rack and pinion combinations operatively coupled to said wafer stage.

66. A process tool, comprising:
a process chamber; and
an adjustable wafer stage in said process chamber that is adapted to receive a wafer positioned thereabove, said wafer stage having a surface in a first plane, said wafer stage being adapted to be lowered to a position wherein said surface of said wafer stage is positioned in a second plane that is offset from and approximately parallel to said first plane.

67. The process tool of claim 66, wherein said adjustable wafer stage further comprises a plurality of pneumatic cylinders operatively coupled to said wafer stage.

68. The process tool of claim 66, wherein said adjustable wafer stage further comprises a plurality of rack and pinion combinations operatively coupled to said wafer stage.

69. A process tool, comprising:

a process chamber; and an adjustable wafer stage in said process chamber that is adapted to receive a wafer positioned thereabove, said wafer stage having a surface in a first plane, said wafer stage being adapted to be tilted such that said surface of said wafer stage is positioned in a second plane, said second plane being tilted relative to said first plane by an angle that does not exceed a value ranging from 0–25 degrees.

70. The process tool of claim 69, wherein said adjustable wafer stage further comprises a plurality of pneumatic cylinders operatively coupled to said wafer stage.

71. The process tool of claim 69, wherein said adjustable wafer stage further comprises a plurality of rack and pinion combinations operatively coupled to said wafer stage.

72. A method, comprising:

providing a process chamber comprised of a wafer stage, said wafer stage having a surface that is adjustable and located in a first plane;

adjusting said surface of said wafer stage by raising said surface of said wafer stage to a position wherein said surface of said wafer stage is positioned in a second plane that is offset from and approximately parallel to said first plane;

positioning a wafer on said wafer stage; and performing a process operation on said wafer positioned on said wafer stage.

73. The method of claim 72, wherein positioning a wafer on said wafer stage comprises positioning a wafer on said wafer stage after said wafer stage has been adjusted.

74. The method of claim 72, wherein positioning a wafer on said wafer stage comprises positioning a wafer on said wafer stage before said wafer stage is adjusted.

75. The method of claim 72, wherein adjusting said surface of said wafer stage comprises adjusting said surface of said wafer stage by actuating at least one of a plurality of pneumatic cylinders that are operatively coupled to said wafer stage.

76. The method of claim 72, wherein adjusting said surface of said wafer stage comprises adjusting said surface of said wafer stage by actuating at least one of a plurality of rack and pinion combinations that are operatively coupled to said wafer stage.

77. A method, comprising:

providing a process chamber comprised of a wafer stage, said wafer stage having a surface that is adjustable and located in a first plane;

adjusting said surface of said wafer stage by lowering said surface of said wafer stage to a position wherein said surface of said wafer stage is positioned in a second plane that is offset from and approximately parallel to said first plane;

positioning a wafer on said wafer stage; and performing a process operation on said wafer positioned on said wafer stage.

78. The method of claim 77, wherein positioning a wafer on said wafer stage comprises positioning a wafer on said wafer stage after said wafer stage has been adjusted.

79. The method of claim 77, wherein positioning a wafer on said wafer stage comprises positioning a wafer on said wafer stage before said wafer stage is adjusted.

80. The method of claim 77, wherein performing a process operation on said wafer comprises performing at least one of a deposition process and an etching process on said wafer in said process chamber.

81. The method of claim 77, wherein adjusting said surface of said wafer stage comprises adjusting said surface of said wafer stage by actuating at least one of a plurality of pneumatic cylinders that are operatively coupled to said wafer stage.

82. A method, comprising:

providing a process chamber comprised of a wafer stage, said wafer stage having a surface that is adjustable and located in a first plane;

adjusting said surface of said wafer stage by tilting said surface of said wafer stage such that said surface of said wafer stage is positioned in a second plane, said second plane being tilted relative to said first plane by an angle that does not exceed a value ranging from 0–25 degrees;

positioning a wafer on said wafer stage; and performing a process operation on said wafer positioned on said wafer stage.

83. The method of claim 82, wherein positioning a wafer on said wafer stage comprises positioning a wafer on said wafer stage after said wafer stage has been adjusted.

84. The method of claim 82, wherein positioning a wafer on said wafer stage comprises positioning a wafer on said wafer stage before said wafer stage is adjusted.

85. The method of claim 82, wherein adjusting said surface of said wafer stage comprises adjusting said surface of said wafer stage by actuating at least one of a plurality of pneumatic cylinders that are operatively coupled to said wafer stage.

86. The method of claim 82, wherein adjusting said surface of said wafer stage comprises adjusting said surface of said wafer stage by actuating at least one of a plurality of rack and pinion combinations that are operatively coupled to said wafer stage.

* * * * *